United States Patent [19]

Corral

[11] Patent Number: 4,476,540
[45] Date of Patent: Oct. 9, 1984

[54] NON-LINEAR FUNCTION GENERATOR

[75] Inventor: José R. Corral, Vaux le Penil, France

[73] Assignee: SNECMA, Paris, France

[21] Appl. No.: 381,394

[22] Filed: May 24, 1982

[30] Foreign Application Priority Data

May 27, 1981 [FR] France .................... 81 10513

[51] Int. Cl.³ .................. G01R 17/20; G01D 5/16
[52] U.S. Cl. .................... 364/851; 364/860
[58] Field of Search .......... 364/842, 851, 858, 860; 328/142

[56] References Cited

U.S. PATENT DOCUMENTS

| | | | |
|---|---|---|---|
| 2,895,046 | 7/1959 | Martin | 328/142 |
| 3,033,462 | 5/1962 | Gucker et al. | 364/860 |
| 3,281,585 | 10/1966 | Zseleczky et al. | 364/851 X |
| 3,536,904 | 10/1970 | Jordan, Jr. et al. | 364/842 |
| 3,712,977 | 1/1973 | Rice, Jr. | 364/842 X |
| 3,824,574 | 7/1974 | Ironside et al. | 364/860 X |

Primary Examiner—Jerry Smith
Assistant Examiner—Allen MacDonald
Attorney, Agent, or Firm—Oblon, Fisher, Spivak, McClelland & Maier

[57] ABSTRACT

A potentiometric system capable of emitting a signal which is a predetermined function of a voltage representative of a position (angular or linear) of a potentiometer slider, including a conventional linear potentiometer, a function generator and a linear transformation circuit. The system enables easy replacement of a conventional potentiometer each time it is necessary to have an output signal which is a complex function of a variable representative of a position.

6 Claims, 11 Drawing Figures

4,476,540

NON-LINEAR FUNCTION GENERATOR

BACKGROUND OF THE INVENTION

1. Field of the Invention

This invention relates to an improved potentiometric system for converting the position of a mobile element into a voltage C which varies according to a predetermined law f between a predetermined minimum value Cmin and a predetermined maximum value Cmax, when the mobile element is moved from one extreme position to another, wherein the mobile element is connected to the slider of a mechanical potentiometer which delivers an initial amplitude signal x, which varies as a function of the position of the mobile element.

2. Description of the Prior Art

The output voltage of the conventional mechanical potentiometer varies as a function of the position of the slider, and generally follows a linear or direct or inverse logarithmic law of variation.

To produce a potentiometer with any variation other than a linear or logarithmic variation, a special resistive track may be designed, along which the slider moves. However, manufacturing costs are high and it is impossible to modify easily the variation. In addition, when several tracks with different variations must be adjusted in relationship to each other, this can only be accomplished in one potentiometer for reasons of stability and precision, which further complicates the construction process and increases the cost.

SUMMARY OF THE INVENTION

Accordingly, one object of this invention is to provide a novel potentiometric system which does not have the disadvantages of the conventional potentiometer, and, in particular, to provide a low cost potentiometric system which provides all of the variation properties desired and whose variation properties may easily be changed, and, if desired, to adjust several potentiometric systems having different variation properties in relationship to each other.

More specifically, the object of this invention is to obtain any variation desired from a conventional mechanical potentiometer, for instance a linear potentiometer, without modifying the track of this potentiometer.

These and other objects are attained by providing a novel potentiometric system of above described type, including a first transformation circuit which receives an initial amplitude signal x and converts it to a second signal, which varies as a function of x according to a predetermined law f between a minimum value k and a maximum value K, when the mobile element is moved from a first to a second position, and a second transformation circuit which receives the second signal and two signals representative of the values Cmin and Cmax to deliver said voltage C according to the following relationship:

$$C = C_{min} + \frac{(C_{max} - C_{min})}{K - k} (f(x) - k)$$

According to the invention, the first transformation circuit includes a means to maintain the characteristic of the second signal at the value of k when the mobile element is moved within a field between its initial extreme position and a first intermediate position. Similarly, means may be provided to maintain the characteristic of the second signal at the value of K when the mobile element is moved within the field between a second intermediate position and its second extreme position. Thus, the useful position field of the mobile element may be limited, that is, the field in which a position variation translates into a output voltage variation, between two intermediate positions between the extreme positions. Advantageously, the initial transformation circuit includes a means for adjusting the position of these intermediate positions.

According to the invention, the amplitude of at least one of the signals (Cmin and Cmax) is variable. Thus the variation trend of the output voltage is defined by the first transformation circuit, while the maximum amplitude of variation of this output voltage and its maximum and minimum values are defined by the second transformation circuit and are adjustable.

According to the invention, the second signal emitted by the first transformation circuit is a series of impulses and the characteristic which varies as a function of the position of the mobile element is the cyclical relationship of the impulses.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
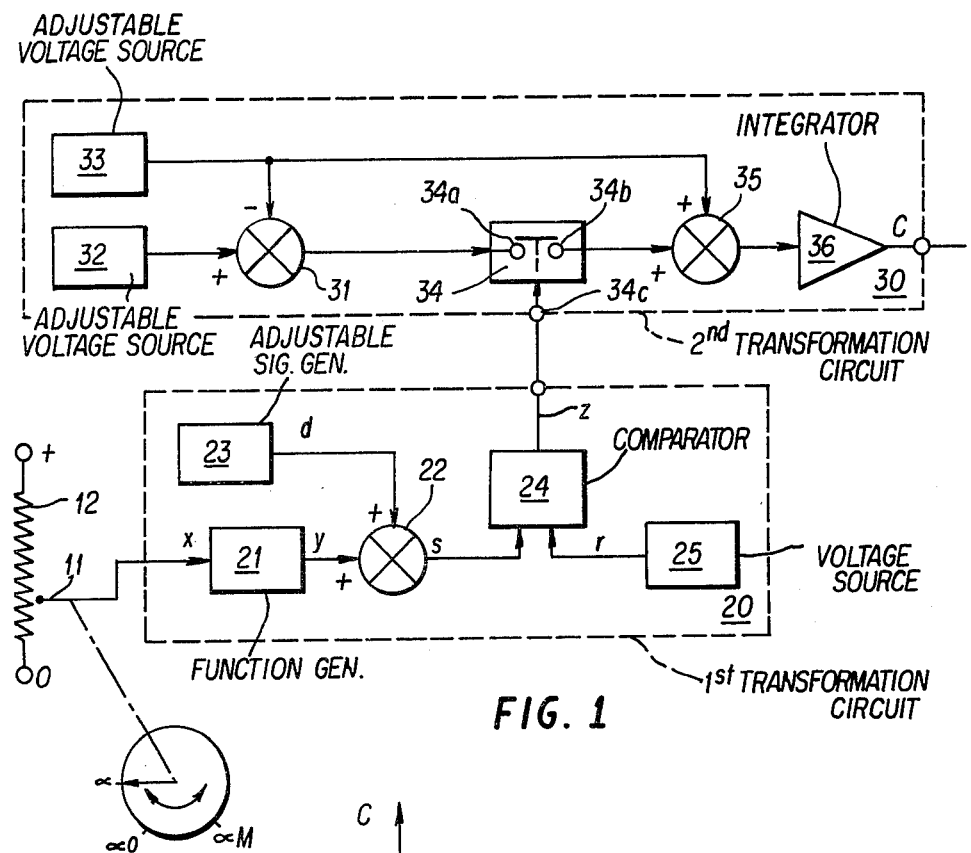
FIG. 1 is a schematic circuit diagram of an embodiment of a potentiometric system according to the invention.

Referring to the drawings, wherein like reference numerals designated identical or corresponding parts throughout the several views, and more particularly to FIG. 1 thereof, reference 10 designates an adjuster, the position of which may vary, for instance by rotation, between two extremes $a_O$ and $a_M$. The adjuster (10) is connected to the slider (11) of a resistive mechanical potentiometer (12). The amplitude x of the voltage available to the slider of potentiometer 12 varies from the minimum value $x_O$ to a maximum value $x_M$ position.

Voltage x is applied at the input of the first transformation circuit (20). This circuit includes a function generator (21) which receives voltage x and emits a signal, $y = h(x)$, h being a function defined below. Signal y is applied to the input of an adder (22) which, on another input, receives a sawtooth signal d supplied by a generator (23). At the output of the adder (22), a sum $s=y+d$ signal is available. This sum s signal is applied to the input of a comparator (24), another input of which receives a reference voltage r supplied by an adjustable, direct voltage source (25). When the signal s is less than or equal to voltage r, the value of voltage z output from the comparator (24) is zero. Conversely, when signal s is greater than voltage r, voltage z at the output of the comparator (24) has a non-zero positive value VI. The output of the comparator (24) constitutes the output of circuit 20.

A second transformation circuit (30) includes a subtractor circuit (31), the first input of which is connected to an adjustable, direct voltage source (32) which provides a voltage of Cmax and the second input is connected to another adjustable, direct voltage source (33) which provides a voltage of Cmin. The output of the subtractor circuit (31) is connected to a terminal (34a) of a switch circuit (34) to apply a voltage of (Cmax−Cmin) to this terminal. The other terminal (34b) of the switch circuit (34) is connected to the first input of an adder (35), the second input of which is connected to the source (33) and the output of which is connected to the input of an integrator circuit (36). The switch (34) has a control terminal (34c) connected to the output of circuit 20. Switch (34) is closed by the output signal of circuit 20 when this signal has a positive value of VI. The output of the integrator (36) constitutes the output of circuit 30 and the output of the potentiometric system where voltage C is available.

The potentiometric system described above operates as nextly described.

Figure 2:
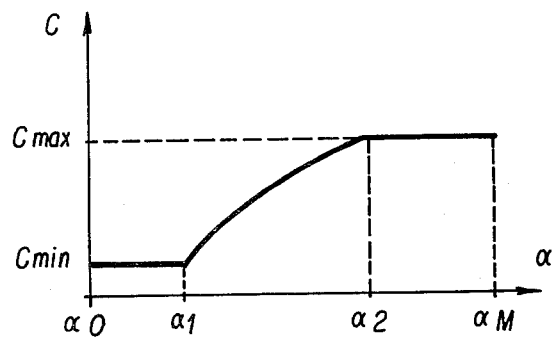
FIG. 2 is a graph showing the variation in output voltage of the potentiometric system illustrated in FIG. 1, as a function of the position of the mobile element of this potentiometric system.

Assume one wants to convert the angular (or linear) $\alpha$ coordinate of the mobile element into an electrical voltage C as shown in FIG. 2, and which may be expressed in the following form:

$$C = f(x) \text{ with } f(x) = C_{min} \text{ when } \alpha_0 \leq \alpha \leq \alpha_1$$
$$f(x) = C_{min} + (C_{max} - C_{min})f'(\alpha)$$
$$\text{when } \alpha_1 < \alpha < \alpha_2, \text{ and}$$
$$f(x) = C_{max} \text{ when } \alpha_2 \leq \alpha \leq \alpha_M.$$

where $\alpha_1$ and $\alpha_2$ are the coordinates of the intermediate positions of the mobile element between its extreme positions $\alpha_O$ and $\alpha_M$ (voltage x being defined below).

The f' function is selected based on requirements; it expresses the desired variations of voltage C when the angular position of the mobile elements varies in the "useful" field between $\alpha_1$ and $\alpha_2$. Below is a description of the manner in which the $\alpha_1$ and $\alpha_2$ positions may be adjusted if necessary.

Voltage x is a function g ($\alpha$) of the $\alpha$ coordinate of the mobile element (10) such as $g(\alpha)=x_o$ when $\alpha=\alpha_o$ and $g(\alpha)=x_M$ when $\alpha=\alpha_M$. A linear potentiometer (12) may be selected, which provides $x=k(\alpha-\alpha_o)$, where k is a constant. This produces $x_o=0$ and $x_M=k(\alpha_m-\alpha_o)$.

Voltage x is transformed by the function of the generator (21) into a $y=f''(\alpha)$ voltage.

Figure 3:
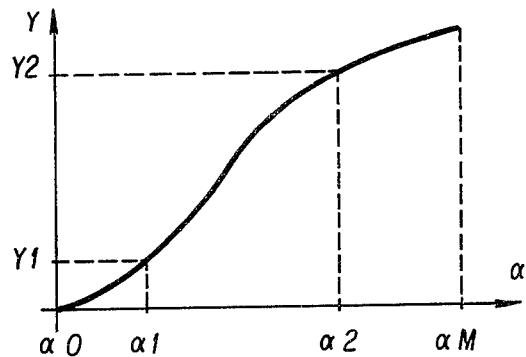
FIG. 3 is a graph showing the variation of a signal at a point of the first transformation circuit of the potentiometric system of FIG. 1 as a function of the position of the mobile element of this potentiometric system.
Figure 7:
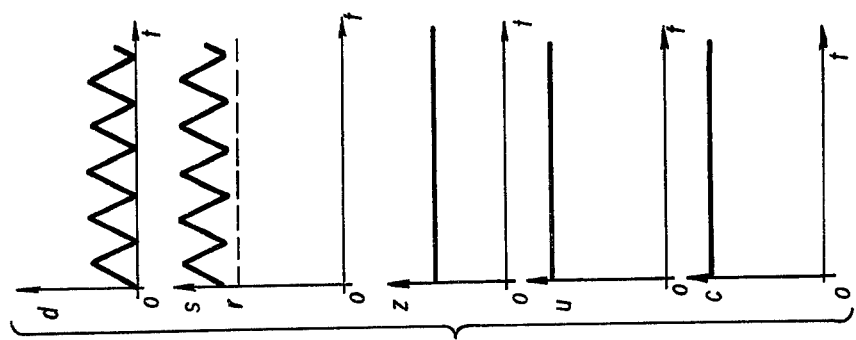
FIGS. 4 to 7 are timing diagrams each showing the signals produced at various points of the first and second transformation circuits of the potentiometric system of FIG. 1 when the mobile element occupies a specific position.
Figure 6:
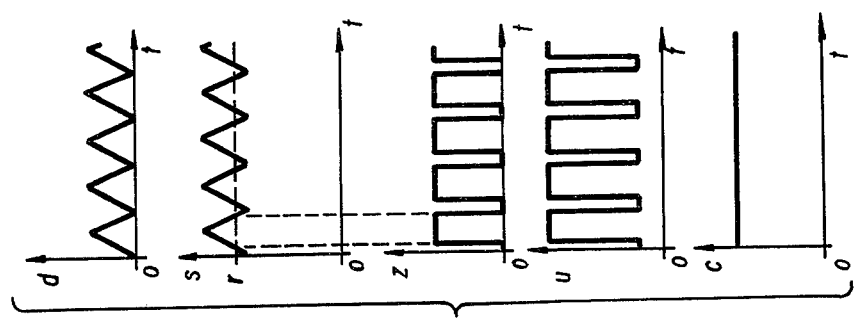
Figure 5:
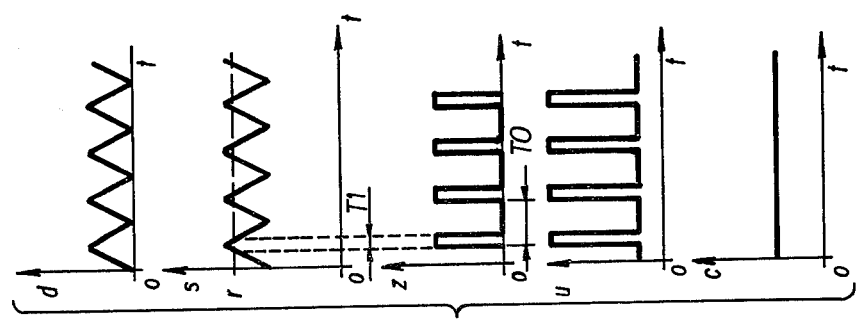
Figure 4:
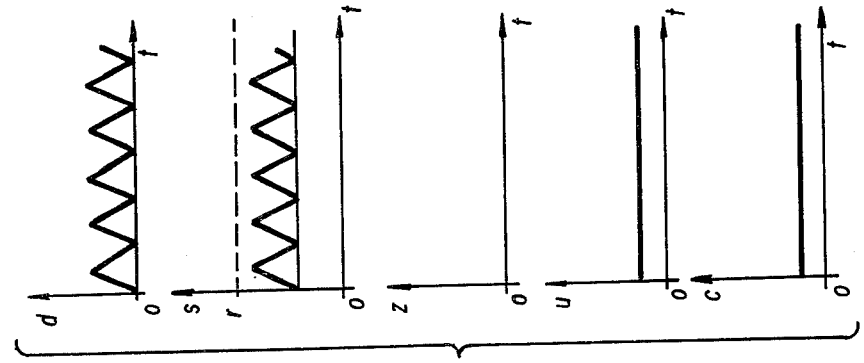

FIG. 3 shows the variations of y as a function of the $\alpha$ coordinate. Each of FIGS. 4 through 7 illustrates, in particular, the variations as a function of the time of the d, s and z signals for the specific $\alpha$ value. For FIGS. 4 through 7, the values $\alpha_4$, $\alpha_5$, $\alpha_6$, $\alpha_7$ have been selected so that $\alpha_o<\alpha_4<\alpha_1$; $\alpha_1<\alpha_5<\alpha_6<\alpha_2$, and $\alpha_2<\alpha_7<\alpha_M$.

Voltage y varies without dropping between a minimum value of $y_O$ and a maximum value of $y_M$ when $\alpha$ varies from $\alpha_o$ to $\alpha_M$.

The maximum amplitude of the sawtooth signal d is designated by $d_M$ and the minimum amplitude of this signal is designated by $d_O$. The reference value r and the values of $d_M$ and $d_O$ are selected so that:

$$r = d_M + y_1 = d_O + y_2$$

where $y_1$ is the value of y when $\alpha=\alpha_1$ and $y_2$ is the value of y when $\alpha=\alpha_2$.

Thus, as long as $\alpha_0<\alpha<\alpha_1$, (FIG. 4), the sum signal s does not exceed the reference value r and the z signal remains zero.

Moreover, as long as $\alpha_2<\alpha<\alpha_M$ (FIG. 7), the s signal exceeds the reference value r and the z signal always remains equal to value VI.

Finally, when $\alpha$ is between $\alpha_1$ and $\alpha_2$, (FIGS. 5 and 6), the output of the comparator (24) moves from 0 to VI during a fraction of each TO period of the d signal. The z signal at the comparator output is thus in the form of a series of impulses, the width T1 of which increases with increases in the amplitude of the y signal. If the cyclical relationship of the impulses produced by the circuit 20 is represented by $\tau$, the result is:

$$\tau = \frac{T1}{T0} = \frac{d_M + y - r}{d_M - d_O} = \frac{y - y_1}{y_2 - y_1}$$

The z signal closes switch 34 when it is at the VI level. Adder 35 receives the Cmin signal on the one hand the Cmax−Cmin signal on the other hand, during periods when switch 34 is closed.

The u signal supplied by the adder (35) and the C signal are shown in FIGS. 4 through 7.

When $\alpha_O<\alpha<\alpha_1$, the adder (34) receives only Cmin and the average value of the output signal of this adder remains equal to Cmin.

When $\alpha_2<\alpha<\alpha_M$, the adder (34) receives on the one hand Cmin, and on the other hand $C_{max}$−Cmin permanently. The average value of the output signal remains equal to Cmax.

Finally, when $\alpha_1<\alpha<\alpha_2$, adder 34 receives Cmin on the one hand and, on the other hand, Cmax−Cmin only during the T1 periods. The average value of the output signal is thus equal to Cmin=$\tau$(Cmax−Cmin), with $\tau$ varying between 0 and 1. This average value is indeed equal to the C value desired, insofar as $$\tau = \frac{y - y_1}{y_2 - y_1} = f'(\alpha),$$

that is, $$y = f''(\alpha) = (y_2 - y_1)f'(\alpha) + y_1$$

The functions f'' and f' are therefore of the same type. Knowing the f'' function, the h function of the function generator (21) can be determined so that $h(x)=h[g(\alpha)]=f''(\alpha)$, that is, $h=f''\cdot^{-1}$; $g^{-1}$ being the inverse of the g function. Having defined the overall potentiometric system illustrated in FIG. 1, certain modifications may be easily made to the f ($\alpha$) function which controls the value of the output voltage C. For example, The extreme values, Cmax and Cmin, of the C voltage may be modified by affecting the sources of direct voltage (32, 33), which can easily be done using potentiometric voltage separators connected to the terminals of a constant continuous voltage source;

The upper limit $\alpha_2$ of the useful field of variation of the mobile element (10) may be adjusted by affecting the direct voltage source (25) which may be done using a potentiometric voltage separator; the value is $y_2 = f'(\alpha_2) = r - d_o$; the minimum value $d_o$ of the sawtooth voltage being fixed (for instance zero) $\alpha_2$ is determined by $r$; $d_o$, $n$ and $\alpha_2$ being fixed, the value $\alpha_1$ may be adjusted, that is, the useful variation field of the mobile element may be adjusted by affecting the total amplitude $D = d_M - d_o$ of the sawtooth voltage; in fact $y_1 = f'(\alpha_1) = r - d_M = r - D - d_o$; therefore, it is sufficient to engender a sawtooth voltage $d_M$ with an amplitude of $D_M$ which is greater than the maximum value that can be attained by the desired D, to apply this $d_M$ voltage to the terminals of a voltage separator which is potentiometric for instance, and to take the d voltage at an adjustable mid-point of this separator.

Figure 8:
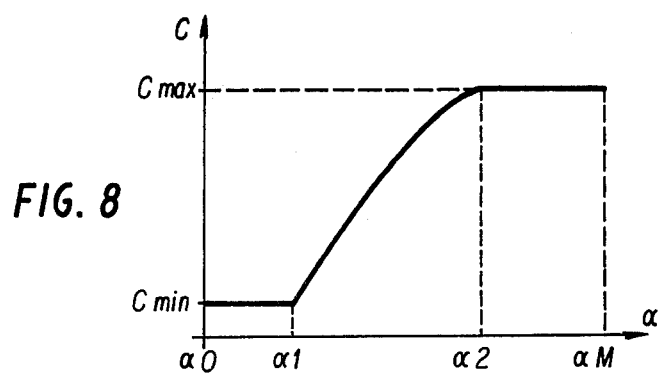
FIGS. 8 to 11 are graphs showing different variations of the output voltage C according to various embodiments of the potentiometric system illustrated in FIG. 1.
Figure 9:
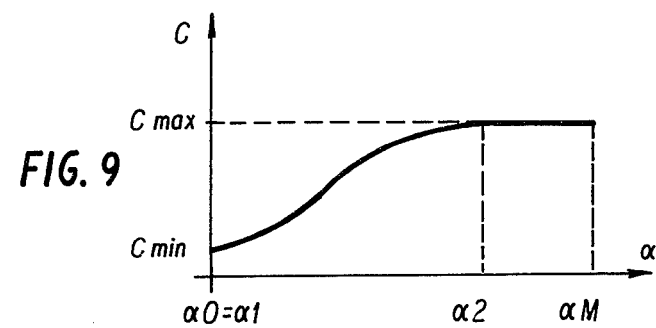
Figure 10:
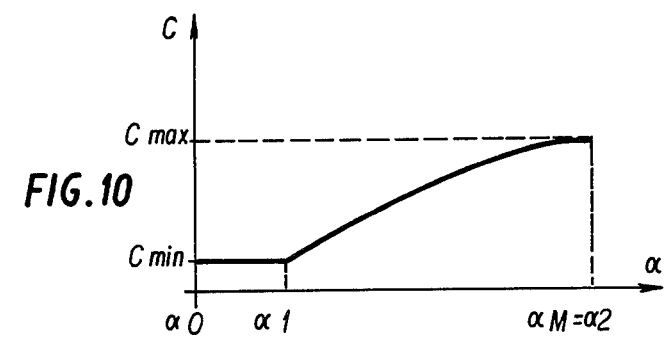

The changes indicated above can easily be made. FIGS. 8, 9 and 10 show the results obtained by a affecting the $C_{max} - C_{min}$ variation amplitude from the output magnitude, by changing the $\alpha_2$ value and making it equal to $\alpha_M$ and by modifying the $\alpha_1$ and $\alpha_2$ values, making them equal to $\alpha_o$ and $\alpha_M$ respectively.

Figure 11:
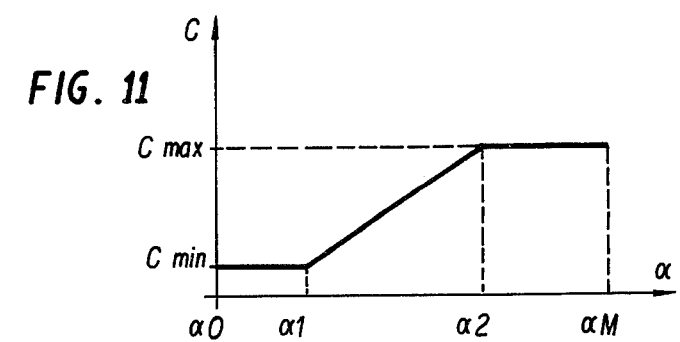

When it is desired to affect the variation trend of voltage C in the interval $\alpha_1 < \alpha < \alpha_2$, it is necessary to madify the function generator (21). It should be noted that by using a linear potentiometer whose slider is directly connected to the adder (22), that is, by short-circuiting the function generator (21) in FIG. 1, one obtains an output voltage which varies in linear relationship between $C_{min}$ and $C_{max}$ in the interval $\alpha_1 < \alpha < \alpha_2$, as shown in FIG. 11.

It should additionally be noted that several potentiometric systems may be adjusted in relation to each other by associating the individual circuits, 20 and 30, for each potentiometric system as a function of the law of variation desired for it, the mechanical potentiometer (12) being commonly employed.

Obviously numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the U.S. is:

1. A potentiometric system for converting the position of a mobile element into a voltage C which varies according to a predetermined law between a predetermined minimum value Cmin and a maximum value Cmax when the mobile element is moved from a first to a second position, said system comprising:
   a linear potentiometer having a slider which is connected to said mobile element and said potentiometer outputting a variable amplitude signal as a function of the position of said slider;
   a function generator controlled by the output signal of said potentiometer whereby said function generator outputs a signal which varies according to a predetermined non-linear function of said output signal of said potentiometer;
   generator means for outputting a sawtooth signal which varies between a minimum value and a predetermined maximum value;
   first adder means which receives on a first input said sawtooth signal and which receives on a second input the output of said function generator whereby said adder means add said signals received on said first and said second input and outputs a sum signal;
   voltage source means outputting a signal representing a predetermined threshold value;
   comparative means for comparing said sum signal and said signal representing said predetermined threshold value and for providing and output.
   subtractor circuit having a first input for receiving said predetermined maximum value Cmax and a second input for receiving said predetermined minimum value Cmin and for delivering an output representative of Cmax−Cmin;
   switch means receiving the output of said subractor means and providing an output controlled by the output of said comparator;
   second adder means receiving on a first input a signal representative of Cmin and on a second input the output of said switch means; and
   an output integrator means outputting the voltage c in the form of a continuous signal wherein the amplitude of said voltage c represents the average value of the signal supplied by said second adder means.

2. The system according to claim 1 wherein said variable voltage C has a value equal to said predetermined minimum value Cmin for a first plurality of positions of said mobile element and wherein said voltage C has a value equal to the maximum value Cmax when said mobile element is in one of a second plurality of positions.

3. A system according to claim 2 wherein the value of said variable voltage C varies between said maximum value Cmax and said minimum value Cmin for a third plurality of positions of said mobile element wherein each of said third plurality of positions is located between said first and second plurality of positions.

4. The system according to claim 3 wherein the output of said comparative means is a repetitive pulse signal for all said third plurality of positions of siad mobile element.

5. The system according to claim 2 further including means for adjusting the amplitude between the maximum and minimum values of said sawtooth signal.

6. The system according to claim 1 further including a means for adjusting the amplitude of at least one of said minimum value Cmin and said maximum value Cmax.

* * * * *

UNITED STATES PATENT AND TRADEMARK OFFICE
CERTIFICATE OF CORRECTION

PATENT NO. : 4,476,540

DATED : OCTOBER 9, 1984

INVENTOR(S) : JOSE R. CORRAL

It is certified that error appears in the above-identified patent and that said Letters Patent is hereby corrected as shown below:

In column 1, delete "1." before Field of the Invention"; also delete "2." before "Description of the Prior Art".

In column 2, line 46, after "position" insert --and--.

In column 4, line 48 (first formula) delete "f($\alpha$)" and substitute --f'($\alpha$)--; (second formula) delete in its entirety and substitute --y = f''($\alpha$) = ($y_2 - y_1$) f'($\alpha$) + $y_1$--;

line 57, "h" and "(x)" must be together; please do not put on separate lines; in both instances "f'" should be changed to --f''--.

In column 5, line 4, the formula should not be on separate lines - must be together; change "f'" in both instances to --f''--;

line 10, the formula should not be on separate lines - must be together; change "f'" to --f''--

UNITED STATES PATENT AND TRADEMARK OFFICE
CERTIFICATE OF CORRECTION

PATENT NO. : 4,476,540   Page 2 of 2

DATED : OCTOBER 9, 1984

INVENTOR(S) : JOSE R. CORRAL

It is certified that error appears in the above-identified patent and that said Letters Patent is hereby corrected as shown below:

line 23, delete "$\alpha_o$" and substitute therefor --$\alpha_O$-- line 26, delete "madify" and substitute therefor --modify--.

In column 6, line 23, delete "subractor" and substitute --subtractor--;

lines 29 and 31, delete "c" and substitute --C--.

Signed and Sealed this

Seventh Day of May 1985

[SEAL]

Attest:

DONALD J. QUIGG

Attesting Officer    Acting Commissioner of Patents and Trademarks